United States Patent [19]
Oh et al.

[11] Patent Number: 5,867,434
[45] Date of Patent: Feb. 2, 1999

[54] INTEGRATED CIRCUIT MEMORY DEVICES HAVING DUMMY MEMORY CELLS THEREIN FOR INHIBITING MEMORY FAILURES

[75] Inventors: Chang-hag Oh; Sang-seok Kang, both of Kyungki-do; Jeon-hyung Lee, Seoul; Jin-seok Lee, Kyungki-do, all of Rep. of Korea

[73] Assignee: Samsung Electronics Co., Ltd., Suwon, Rep. of Korea

[21] Appl. No.: 912,486

[22] Filed: Aug. 18, 1997

[30] Foreign Application Priority Data

Oct. 10, 1996 [KR] Rep. of Korea .................. 1996 45129

[51] Int. Cl.[6] .................................................. G11C 7/00
[52] U.S. Cl. ............................................ 365/200; 365/149
[58] Field of Search ............................. 365/185, 48, 149, 365/200, 185.26, 185.27, 185.01

[56] References Cited

U.S. PATENT DOCUMENTS

| | | | |
|---|---|---|---|
| 5,300,814 | 4/1994 | Matsumoto | 257/48 |
| 5,363,325 | 11/1994 | Sunouchi et al. | 365/149 |
| 5,386,382 | 1/1995 | Ahn | 365/174 |
| 5,574,680 | 11/1996 | Kim et al. | 365/149 |

Primary Examiner—David Nelms
Assistant Examiner—Thong Le
Attorney, Agent, or Firm—Myers Bigel Sibley & Sajovec

[57] ABSTRACT

Integrated circuit memory devices contain an array of active memory cells and at least one column of dummy memory cells having missing electrical connections to either a dummy bit line and/or respective storage electrodes. The dummy memory cells are provided with missing electrical connections so that formation of stray electrical "shorts" between storage electrodes of dummy and active memory cells during fabrication do not cause memory failures when the memory devices are installed. In particular, integrated circuit memory devices are provided which comprise an array of active DRAM memory cells and a column of dummy DRAM memory cells. The active DRAM memory cells each contain electrical connections to a respective active bit line and a respective storage electrode, but the dummy DRAM memory cells are each devoid of an electrical connection to a dummy bit line and/or a respective storage electrode. Accordingly, the formation of a stringer (e.g., electrical short) between a storage capacitor of an active memory cell and a dummy memory cell does not result in a memory failure even if the word line coupled to the dummy memory cell is activated and the dummy bit line is biased at a potential which is different from the potential of the storage capacitor of the active memory cell.

15 Claims, 3 Drawing Sheets

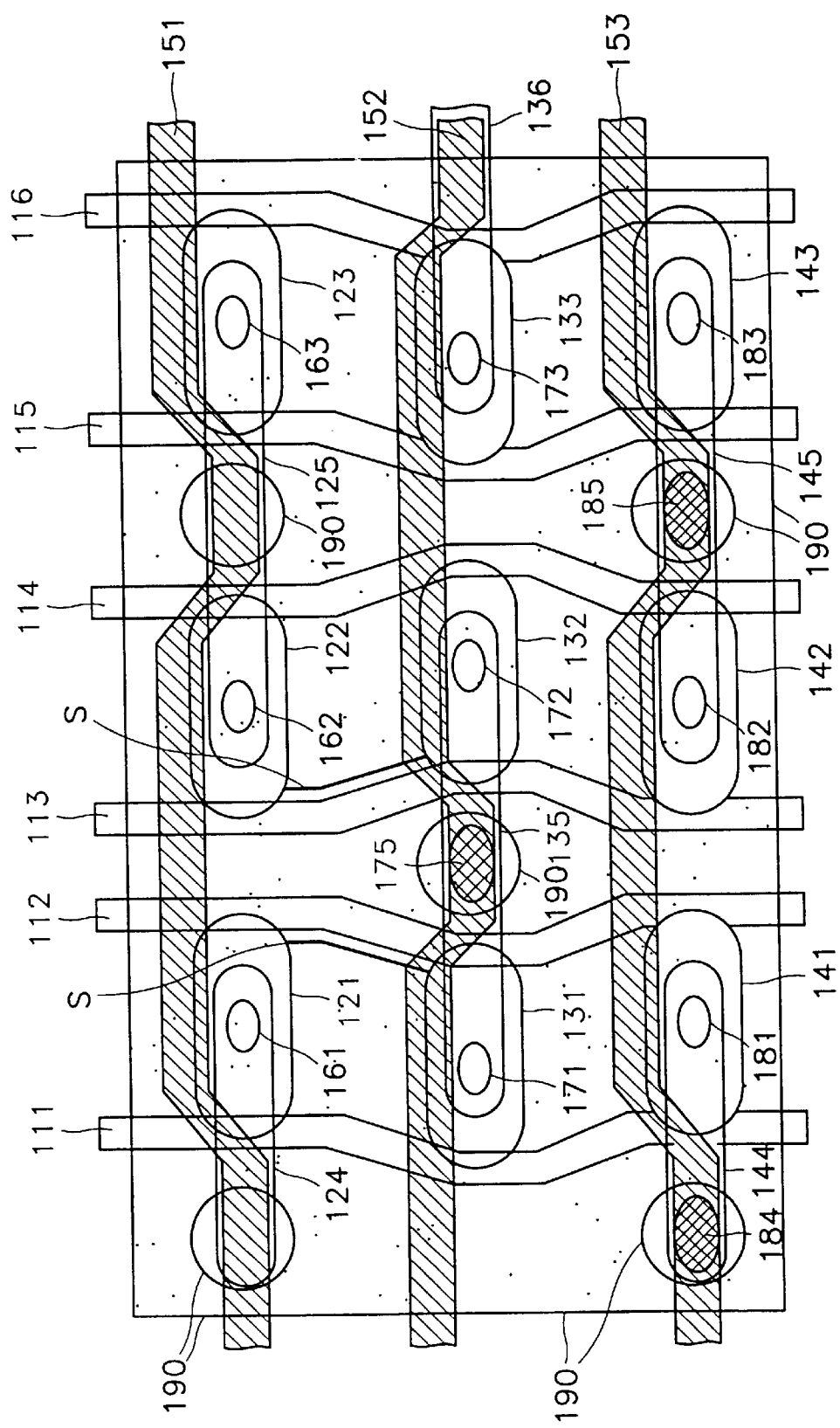

INTEGRATED CIRCUIT MEMORY DEVICES HAVING DUMMY MEMORY CELLS THEREIN FOR INHIBITING MEMORY FAILURES

FIELD OF THE INVENTION

The present invention relates to integrated circuits and more particularly to integrated circuit memory devices.

BACKGROUND OF THE INVENTION

A semiconductor memory device, such as a DRAM device, can consist of a memory cell region in which unit cells for storing information are arranged as an array, and a peripheral circuit region for driving the unit cells. Each unit cell in the memory cell region may include a capacitor and an access transistor, and the capacitor includes a storage electrode, a dielectric layer, and a plate electrode. To increase the capacitance of the thus-constituted capacitor, a cylindrical structure or a stack structure using a dielectric layer of a high dielectric constant are widely employed. By forming such a capacitor in the memory cell region, a step is typically formed at the boundary between the peripheral circuit region and the memory cell region. Since the pattern density of the memory cell region is higher than that of the peripheral circuit region, the patterns in the edge and center of the memory cell region are formed with different bias from each other due to the proximity effect in photolithography processes. Thus, photolithography process margins are typically reduced in the memory cell region.

To solve the above discrepancy, a method has recently been suggested in which at least one dummy column is disposed at the edge of a memory cell region. In this method, the difference between the sizes of patterns formed in the center and edge of the memory cell region can be further reduced. Here, the dummy column has a corresponding dummy bit line coupled thereto.

FIG. 1 is a layout view of the edge portion of a conventional memory cell region in an exemplary DRAM memory device. Referring to FIG. 1, the conventional memory cell of the DRAM device includes a plurality of cell active regions 24, 25, 35, 36, 44, and 45 arranged in a zigzag pattern, a plurality of word lines 11, 12, 13, 14, 15 and 16 arranged so that a pair of word lines cross over each active region, drain regions each defined in an active region between a pair of word lines, a pair of source regions defined by active regions adjacent to the drain regions with a pair of word lines intervening between the source regions, a plurality of storage electrode contact holes 61, 62, 63, 71, 72, 73, 81, 82, and 83 for exposing the source regions, a plurality of storage electrodes 21, 22, 23, 31, 32, 33, 41, 42, and 43 connected to the source regions via respective storage electrode contacts, plate electrodes 90 which expose the drain regions, a plurality of bit line contacts 64, 65, 75, 84, and 85 for contacting a predetermined area of each drain region, and a plurality of bit lines 51, 52, and 53 covering the bit line contacts and disposed in a perpendicular direction relative to the plurality of word lines. Here, the bit line 51 disposed at the outermost edge of the memory cell region serves as a dummy bit line, and the bit lines 52 and 53 adjacent to the dummy bit line 51 serve as actual bit lines for transferring information. Here, as will be understood by those skilled in the art, a ground potential or a power voltage is generally applied to the dummy bit line 51.

When a DRAM cell is formed using a mask fabricated by the above layout, a stringer S (i.e., electrical "short") may form between adjacent storage electrodes. As shown in FIG. 1, when the stringer S is produced between a storage electrode of a dummy cell (e.g., storage electrode 21) which is connected to the dummy bit line 51, and a storage electrode of an actual cell adjacent to the dummy cell (e.g., the storage electrode 31), the DRAM device may malfunction. For example, when a power voltage is applied to both the bit line 52 and the word line 12 to store information corresponding to logic "1" in the storage electrode 31, a portion of the semiconductor channel region where the active region 35 and the word line 12 intersect is inverted and the power voltage is transferred to the storage electrode 31. Here, in the event the dummy bit line 51 is set at ground potential and the word line 11 is not selected, the storage electrode 21 is electrically isolated from the dummy bit line 51. Thus, the storage electrode 21 has the same potential as that of the storage electrode 31, that is, the power voltage (i.e., logic "1").

However, when the power voltage is applied to the word line 11 to store predetermined information in the storage electrode 41 or to read out the information stored in the storage electrode 41, a channel is formed at the portion where the word line 11 and an active region 24 intersect. When this occurs, the storage electrode 21 becomes electrically connected to the grounded bit line 51, and thus the storage electrode 21 is "pulled" to the ground potential. In addition, since the storage electrode 31 is also connected to the storage electrode 21 via the stringer S, information stored in the storage electrode 31 of an actual memory cell, that is the information corresponding to the logic "1", vanishes. Therefore, when the information stored in the storage electrode 31 is read, unintended information is accessed and an operational failure occurs.

Alternatively, in the event a power voltage (i.e., logic "1") is applied to the dummy bit line 51, when information corresponding to logic "0" is stored in the storage electrode 31 and the information of the storage electrode 31 is read, incorrect information corresponding to the logic "1" will be read.

Thus, although the conventional DRAM device can reduce pattern failures generated at the edge of a memory cell region by providing a dummy bit line, it typically cannot overcome operation failures caused by a stringer remaining between storage electrodes.

SUMMARY OF THE INVENTION

It is therefore an object of the present invention to provide improved integrated circuit memory devices.

It is another object of the present invention to provide integrated circuit memory devices having reduced susceptibility to memory cell failure caused by stringer defects.

These and other objects, features and advantages of the present invention are provided by integrated circuit memory devices which comprise an array of active memory cells and at least one column of dummy memory cells having missing electrical connections to either a dummy bit line and/or respective storage electrodes. The dummy memory cells are provided with missing electrical connections so that the occurrence of stray electrical "shorts" (e.g., stringers) between storage electrodes of dummy and active memory cells during fabrication does not cause memory failures when the active memory devices are programmed and read.

In particular, according to one embodiment of the present invention, integrated circuit memory devices are provided which comprise an array of active DRAM memory cells and a column of dummy DRAM memory cells. The active DRAM memory cells each contain electrical connections to a respective active bit line and a respective storage electrode, but the dummy DRAM memory cells are each devoid of an electrical connection to a dummy bit line and/or a respective storage electrode. Accordingly, the formation of a stringer (e.g., electrical short) between a storage electrode of an active memory cell and a dummy memory cell does not result in a memory failure even if the word line coupled to the dummy memory cell is activated and the dummy bit line is biased at a potential which is different from the potential of the storage electrode of the active memory cell. According to another embodiment of the present invention, a preferred integrated circuit memory device comprises a plurality of active bit lines on a semiconductor substrate and a dummy bit line adjacent the plurality of active bit lines. An array of memory cells are also provided in the substrate. The array of memory cells are arranged as a plurality of rows and columns of active memory cells which each contain a storage electrode that can be electrically coupled to a respective one of the active bit lines and a column of dummy memory cells which each contain a storage electrode that cannot be electrically coupled to any of the plurality of active bit lines or the dummy bit line. Thus, the storage electrodes associated with the dummy cells cannot be actively biased at the potential of the dummy bit line. Instead, the storage electrodes associated with the dummy memory cells are maintained in a permanent "floating" state relative to the dummy bit line, which means that stray electrical connections between the storage electrodes of dummy cells and storage electrodes of adjacent active memory cells will not result in memory failure even when the word lines to the dummy memory cells are activated.

BRIEF DESCRIPTION OF THE DRAWINGS

FIG. 3 is a layout schematic view of a DRAM memory device according to a second embodiment of the present invention.

DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
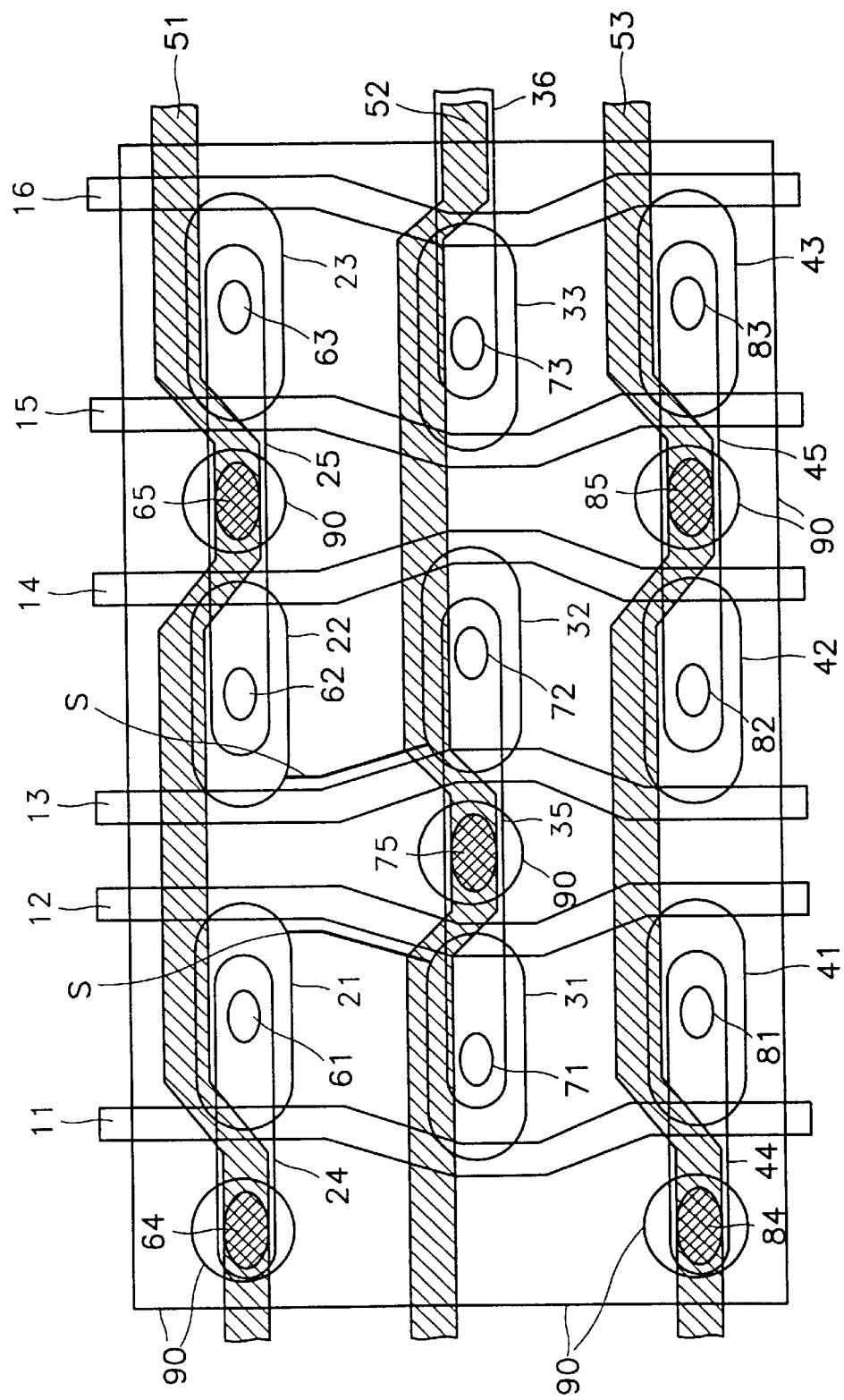
FIG. 1 is a layout schematic view of a DRAM memory device according to the prior art.
Figure 2:
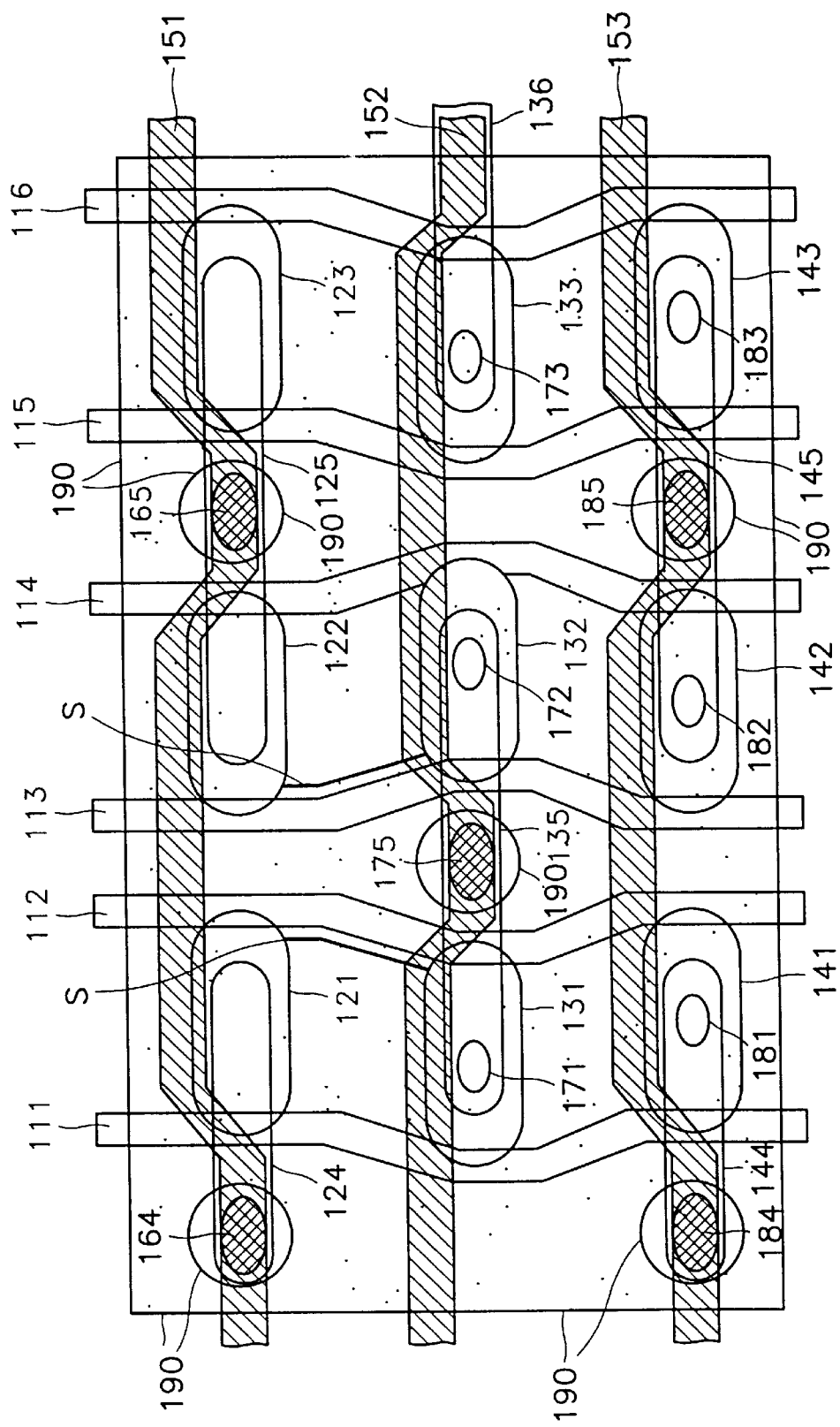
FIG. 2 is a layout schematic view of a DRAM memory device according to a first embodiment of the present invention.

Referring now to FIGS. 2 and 3, an integrated circuit memory device according to first and second embodiments of the present invention includes an array of DRAM memory cells having a column of dummy DRAM memory cells therein. In particular, the memory devices are formed to have a plurality of semiconductor active regions 124, 125, 135, 136, 144 and 145 arranged in a zigzag pattern, a plurality of word lines 111, 112, 113, 114, 115 and 116 arranged so that each pair of word lines crosses over an active region of a DRAM memory cell. The memory cells also include a common drain region (e.g., N-type) in each active region (between a pair of word lines), a pair of source regions (e.g., N-type) in each active region with each source region being separated from a respective drain region by a word line, and a plurality of dummy storage electrodes 121, 122 and 123 and plurality of active storage electrodes 131, 132, 133, 141, 142, and 143 extending opposite respective source regions. A dummy bit line 151 and a plurality of active bit lines 152 and 153 are also provided. These bit lines pass over respective drain regions in each column of cells. Plate electrodes 190 are also provided to overlap respective storage electrodes 121, 122, 123, 131, 132, 133, 141, 142 and 143 (with insulating layers between the plate electrodes and the storage electrodes). Here, a word line, and the drain and source regions defined at both sides of a word line constitute an access transistor, and a storage electrode, an insulating layer, and a plate electrode constitute a storage capacitor. As illustrated, each active region is preferably in the shape of a bar and the plurality of word lines 111, 112, 113, 114, 115 and 116 preferably extend perpendicular to the plurality of active regions. The insulating layers which separate each plate electrode from a respective storage electrode may be a dielectric layer or a ferroelectric layer. When the ferroelectric layer is used as the insulating layer, a ferroelectric memory device requiring no refresh operations can be formed.

According to the embodiments of FIGS. 2 and 3, the bit line 151 disposed adjacent the outer edge of the memory cell array region serves as the dummy bit line which is preferably held at ground potential (GND) or at a power voltage potential (VCC) during operation of the memory device. Here, the dummy bit line 151 is patterned to extend opposite a series of drain regions of a column of dummy memory cells. The active memory cells have drain regions which are electrically connected via the bit line contacts 175, 184 and 185 to respective ones of the active bit lines 152 and 153, and source regions which are electrically connected via storage electrode contacts 171, 172, 173, 181, 182 and 183 to respective storage electrodes 131, 132, 133, 141, 142 and 143, as illustrated. Thus, the application of a predetermined logic signal (e.g., logic 1) to word line 111 will cause the formation of a conductive inversion layer channel (e.g., N-type channel) in the active region 144 so that the storage electrode 141 becomes electrically coupled to the bit line 153.

In contrast, the dummy memory cells of FIG. 2 do not have storage electrode contacts (but do have bit line contacts 164 and 165) and the dummy memory cells of FIG. 3 do not have bit line contacts (but do have storage electrode contacts 161, 162 and 163). Thus, the storage electrodes 121, 122 and 123 of the dummy memory cells in FIGS. 2 and 3 cannot become electrically connected to the dummy bit line 151 even if the dummy memory cells are "turned-on" (i.e., inversion layer channels are generated in the active regions 124 and 125) by the application of predetermined logic signals to the word lines 111–116. Accordingly, even if the storage electrodes 121–123 of dummy memory cells become electrically "shorted" by stringer S defects to storage electrodes 131–133 of active memory cells, the potential of the dummy bit line will not be transferred to the storage electrodes 131–133 of the active memory cells.

For example, even in the event a stringer S is formed between the storage electrode 121 of a dummy memory cell and the storage electrode 131 of an actual memory cell and a ground potential is applied to the dummy bit line 151, a memory failure will not occur when programming or reading the actual memory cell having the storage electrode 131 because the storage electrode 121 of the dummy memory cell will remain electrically disconnected from the dummy bit line 151 at all times.

These aspects of the present invention will now be described in more detail. First, in the first embodiment of the present invention (see FIG. 2) having only the bit line contacts 164 and 165 in the dummy memory cell connected to the dummy bit line 151, when a power voltage is applied to both the bit line 152 and the word line 112 to store information corresponding to logic "1" in the storage electrode 131, a channel region at the portion where the word line 112 and the active region 135 intersect is inverted and the power voltage is transferred to the storage electrode 131. At this time, the power voltage is also applied to the storage electrode 121 due to the stringer S. Subsequently, when the power voltage is applied to the word line 111 to read information stored in a storage electrode in a predetermined memory cell (e.g., storage electrode 141) a channel is formed at the portion where the word line 111 and the active region 124 intersect. However, since there is no storage electrode contact for exposing the source region overlapped with the storage electrode 121, the storage electrode 131 is entirely isolated and thus there is no connection between the storage electrode 131 and the dummy bit line 151. Therefore, the information stored in the storage electrode 131 does not vanish. Consequently, when the power voltage is applied to the word line 112 to read the information stored in the storage electrode 131, initial information stored in the storage electrode 131, that is, the information corresponding to logic "1", is accessed, thus preventing operation failures caused by the stringer S. Meanwhile, when the power voltage is applied to the dummy bit line 151, the information corresponding to logic "0" is stored in the storage electrode 131, and then the information stored in the storage electrode 131 is read, it is obvious that the information corresponding to logic "0" can be accessed.

Second, in the second embodiment of the present invention (see FIG. 3) having only the storage electrode contacts 161, 162, and 163 in a dummy memory cell connected to the dummy bit line 151 (held at ground potential), when the power voltage is applied to both the bit line 152 and the word line 112 to store the information corresponding to a logic "1" in the storage electrode 131, a channel region at the portion where the word line 112 and the active region 135 intersect is inverted and thus the power voltage is transferred to the storage electrode 131. At this time, the power voltage is also applied to the storage electrode 121 due to the stringer S. Subsequently, when the power voltage is applied to the word line 111 to read the information stored in a storage electrode in a predetermined memory cell (e.g., the storage electrode 141) a channel is formed at the portion where the word line 111 and the active region 124 intersect. However, since there is no bit line contact for exposing a drain region overlapped with the dummy bit line 151, the storage electrode 121 is not electrically connected to the dummy bit line 151. Therefore, the information stored in the storage electrode 131 does not vanish. Consequently, when the power voltage is applied to the word line 112 to read the information stored in the storage electrode 131, initial information stored in the storage electrode 131, that is, the information corresponding to logic "1", is accessed, thus preventing operation failures caused by the stringer S. Meanwhile, when the power voltage is applied to the dummy bit line 151, the information corresponding to logic "0" is stored in the storage electrode 131, and then the information stored in the storage electrode 131 is read out, it is obvious that the information corresponding to logic "0" can be accessed.

As described above, according to the present invention, even if a stringer is formed between a storage electrode of a dummy memory cell connected to a dummy bit line and its adjacent storage electrode of an actual memory cell, operation failures can be prevented when driving a memory cell, by eliminating either the bit line contact and/or the storage electrode contact in each dummy memory cell connected to the dummy bit line.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
 a plurality of active bit lines on a semiconductor substrate;
 a dummy bit line adjacent said plurality of active bit lines, on the substrate; and
 an array of memory cells in the substrate, said array of memory cells arranged as a plurality of rows and columns of active memory cells which each contain a storage electrode that can be electrically coupled to a respective one of said plurality of active bit lines and a column of dummy memory cells which each contain a dummy storage electrode that cannot be electrically coupled to any of said plurality of active bit lines or said dummy bit line.

2. The memory device of claim 1, wherein the substrate comprises a semiconductor region of first conductivity type therein extending to a face thereof; wherein each of said dummy memory cells comprises a dummy source region of second conductivity type in the region of first conductivity type; and wherein each of said dummy source regions extends opposite a respective dummy storage electrode but is electrically disconnected therefrom.

3. The memory device of claim 1, wherein the substrate comprises a semiconductor region of first conductivity type therein extending to a face thereof; wherein each of said dummy memory cells comprises a dummy drain region of second conductivity type in the region of first conductivity type; and wherein each of said dummy drain regions extends opposite said dummy bit line but is electrically disconnected therefrom.

4. The memory device of claim 2, wherein the substrate comprises a semiconductor region of first conductivity type therein extending to a face thereof; wherein each of said dummy memory cells comprises a dummy drain region of second conductivity type in the region of first conductivity type; and wherein each of said dummy drain regions extends opposite said dummy bit line but is electrically disconnected therefrom.

5. The memory device of claim 1, further comprising a plurality of word lines which are electrically coupled to active regions in said active memory cells and dummy active regions in said dummy memory cells.

6. The memory device of claim 5, wherein each of said plurality of word lines extends opposite said plurality of active bit lines and said dummy bit line.

7. The memory device of claim 2, wherein the substrate comprises a memory cell region therein containing said array of memory cells and a peripheral circuit region therein containing peripheral circuits which drive said array of memory cells; and wherein said dummy bit line is disposed between said plurality of active bit lines and the peripheral circuit region.

8. An integrated circuit memory device, comprising:
 a plurality of active bit lines on a semiconductor substrate;
 a dummy bit line adjacent said plurality of active bit lines, on the substrate;

a plurality of word lines on the substrate, each of said word lines crossing said plurality of active bit lines and said dummy bit line; and an array of memory cells in the substrate, said array of memory cells arranged as:

a plurality of rows and columns of active memory cells which each contain a semiconductor channel region of first conductivity type and a storage electrode that can be electrically coupled via an inversion layer channel in the semiconductor channel region to a respective one of said plurality of active bit lines: and a column of dummy memory cells which each contain a dummy storage electrode that cannot be electrically coupled to any of said plurality of active bit lines or said dummy bit line.

9. The memory device of claim 8, wherein the substrate comprises a semiconductor well region of first conductivity type therein extending to a face thereof; wherein each of said dummy memory cells comprises a dummy source region of second conductivity type in the well region; and wherein each of said dummy source regions extends opposite a respective storage electrode but is electrically disconnected therefrom.

10. The memory device of claim 8, wherein the substrate comprises a semiconductor well region of first conductivity type therein extending to a face thereof; wherein each of said dummy memory cells comprises a dummy drain region of second conductivity type in the well region; and wherein each of said dummy drain regions extends opposite said dummy bit line but is electrically disconnected therefrom.

11. The memory device of claim 9, wherein the substrate comprises a semiconductor well region of first conductivity type therein extending to a face thereof; wherein each of said dummy memory cells comprises a dummy drain region of second conductivity type in the well region; and wherein each of said dummy drain regions extends opposite said dummy bit line but is electrically disconnected therefrom.

12. The memory device of claim 8, wherein said plurality of word lines are electrically coupled to active regions in said active memory cells and dummy active regions in said dummy memory cells.

13. The memory device of claim 9, wherein the substrate comprises a memory cell region therein containing said array of memory cells and a peripheral circuit region therein containing peripheral circuits which drive said array of memory cells; and wherein said dummy bit line is disposed between said plurality of active bit lines and the peripheral circuit region.

14. An integrated circuit memory device, comprising:

an array of active DRAM memory cells; and a column of dummy DRAM memory cells which each contain an electrically floating dummy storage electrode, adjacent said array of active DRAM memory cells.

15. An integrated circuit memory device, comprising:

an array of active DRAM memory cells which each contain electrical connections to a respective bit line and a respective storage electrode; and a column of dummy DRAM memory cells which are each devoid of an electrical connection to a dummy bit line and/or a respective dummy storage electrode.

* * * * *